(12) United States Patent
Lin et al.

(10) Patent No.: US 8,156,412 B2
(45) Date of Patent: Apr. 10, 2012

(54) TREE DECODING METHOD FOR DECODING LINEAR BLOCK CODES

(75) Inventors: Mao-Chao Lin, Taipei (TW); Chia-Fu Chang, Taipei (TW)

(73) Assignee: National Taiwan University, Taipei (TW)

( * ) Notice: Subject to any disclaimer, the term of this patent is extended or adjusted under 35 U.S.C. 154(b) by 431 days.

(21) Appl. No.: 12/568,673

(22) Filed: Sep. 29, 2009

(65) Prior Publication Data

US 2010/0318873 A1    Dec. 16, 2010

(30) Foreign Application Priority Data

Jun. 15, 2009    (TW) ................................ 98119947 A

(51) Int. Cl.
*H03M 13/03*    (2006.01)
(52) U.S. Cl. ........ 714/786; 714/752; 714/799; 714/800; 714/794; 714/780
(58) Field of Classification Search .................. None
See application file for complete search history.

(56) References Cited

U.S. PATENT DOCUMENTS

| | | | | |
|---|---|---|---|---|
| 4,015,238 A | * | 3/1977 | Davis ........................... | 714/792 |
| 6,947,503 B2 | * | 9/2005 | Marsili ........................ | 375/341 |
| 6,961,392 B2 | * | 11/2005 | Heegard et al. ............... | 375/341 |
| 7,197,691 B2 | * | 3/2007 | Beerel et al. ................. | 714/795 |
| 2007/0283232 A1 | * | 12/2007 | Shieh ........................... | 714/794 |

OTHER PUBLICATIONS

Han et al., "Efficient Maximum-Likelihood Soft-Decision Decoding of Linear Block Codes Using Algorithm A", 1993, IEEE Information Theory Proceedings, p. 27.*
Ehroot et al., "A Decoding of Block Codes", 1996, IEEE Transactions on Communications, pp. 1052-1056.*

* cited by examiner

*Primary Examiner* — John Trimmings
(74) *Attorney, Agent, or Firm* — Lin & Associates IP, Inc.

(57) ABSTRACT

A tree decoding method for decoding a linear block code is provided. According to the tree decoding method, an estimated path metric of node v is $f(v)=g(v)+h(v)$, where $g(v)$ represents a sum of bit metrics of all bits on a path from the root node to the node v, and $h(v)$ represents a lowest bound of estimated accumulated bit metrics from the node v to the goal node. The present invention creatively improves the approach for calculating $h(v)$. According to the present invention, some parity bits are only related to a part of the information bits, according to which the edge metric $h(v)$ of the parity bits can be preliminarily incorporated into the path metric of the part of the information bits. As such, some nodes having inferior path metric could be eliminated in advance, thus minimizing the searching range and simplifying the decoding complexity.

13 Claims, 11 Drawing Sheets

$$\mathbf{G} = \begin{bmatrix} 1 & 0 & 0 & 0 & 1 & 0 & 1 & 1 \\ 0 & 1 & 0 & 0 & 1 & 1 & 1 & 0 \\ 0 & 0 & 1 & 0 & 1 & 1 & 0 & 1 \\ 0 & 0 & 0 & 1 & 0 & 1 & 1 & 1 \end{bmatrix}$$

Fig. 1a

$$\mathbf{G} = \begin{bmatrix} 1 & 0 & 0 & 0 & 1 & 0 & 1 & 1 \\ 0 & 1 & 0 & 0 & 1 & 1 & 1 & 0 \\ 0 & 0 & 1 & 0 & 1 & 1 & 0 & 1 \\ 0 & 0 & 0 & 1 & 0 & 1 & 1 & 1 \end{bmatrix} \Rightarrow \mathbf{G'} = \begin{bmatrix} 1 & 0 & 0 & 0 & 1 & 1 & 1 & 0 \\ 0 & 1 & 0 & 0 & 1 & 1 & 0 & 1 \\ 0 & 0 & 1 & 0 & 1 & 0 & 1 & 1 \\ 0 & 0 & 0 & 1 & 0 & 1 & 1 & 1 \end{bmatrix}$$

Fig. 2a

$$\mathbf{G'} = \begin{bmatrix} 1 & 0 & 0 & 0 & 1 & 1 & 1 & 0 \\ 0 & 1 & 0 & 0 & 1 & 1 & 0 & 1 \\ 0 & 0 & 1 & 0 & 1 & 0 & 1 & 1 \\ 0 & 0 & 0 & 1 & 0 & 1 & 1 & 1 \end{bmatrix} \Rightarrow \mathbf{G''} = \begin{bmatrix} 1 & 0 & 0 & 1 & 0 & 1 & 1 & 0 \\ 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{bmatrix}$$

Fig. 3a

TREE DECODING METHOD FOR DECODING LINEAR BLOCK CODES

BACKGROUND OF THE INVENTION

1. Field of the Invention

The present invention relates generally to a tree decoding method for decoding the linear block code, and more particularly, to a tree decoding method which decreases the edges required for decoding by utilizing parity bits in advance, so as to achieve a lower decoding complexity.

2. The Prior Arts

Due to the channel impairment and the undesired noise interference, information may likely be corrupted by errors in the transmission. Accordingly, error-correcting codes are usually needed for allowing the receiver end to correct the error-corrupted information. The class of linear block codes is an important class of error-correcting codes. Typical linear block codes include turbo code, low density parity check (LDPC) codes, quadratic residue (QR) codes, extended quadratic residue (EQR) codes, Bose-Chaudhuri Hocquenghem (BCH) codes and many more.

A linear block code can be encoded by multiplying a k×n generator matrix G with k information bits $(u_0, u_1, \ldots, u_{k-1})$, thus generating an n-bit codeword $c=(c_0, c_1, \ldots, c_{n-1})$. Then, a signal, $((-1)^{c_0}, (-1)^{c_1}, \ldots, (-1)^{c_{n-1}})$, is transmitted into the channel. With respect to the linear block code, the receiver end decodes the received signal, $r=(r_0, r_1, \ldots, r_{n-1})$, to recover the information bits, where $r_i$ is an error-corrupted version of $(-1)^{c_i}$.

Supposing that the codeword $c=(c_0, c_1, \ldots, c_{n-1})$ generated by the generator matrix G includes k information bits and n-k parity bits, G is therefore a systematic generator matrix. Specifically, when the 0 to $(k-1)^{th}$ columns constitute a k×k identity matrix, the information bits $(u_0, u_1, \ldots, u_{k-1})$ correspond to a codeword $(c_0, c_1, \ldots, c_{n-1})=(u_0, u_1, \ldots, u_{k-1}, p_k, \ldots, p_{n-1})$, where $p_k, \ldots, p_{n-1}$ are parity bits. In such a way, a code tree can be obtained in accordance with the generator matrix G.

Taking an (n, k)=(8, 4) extended Hamming code as an example for illustration, the amount of the information bits is k=4. The transmission end utilizes a generator matrix G as shown in FIG. 1a to encode the 4-bit information (k=4) into a codeword having a length of n=8. In such a way, a code tree as shown in FIG. 1b can be obtained in accordance with the generator matrix G as shown in FIG. 1a. The code tree starts to emanate from the root node of level 0. With respect to the prior k (i.e., 4 hereby) levels (i.e., levels 0, 1, 2, and 3 hereby), each node can be bifurcated into two edges, and each of the two edges represents a distinctive information bit, in which a solid line represents an information bit of 0, and a dashed line represents an information bit of 1. With respect to the latter n-k levels (i.e., levels 4, 5, 6, and 7 hereby), each node emanates into a single edge, which represents a parity bit. For example, a node of level j represents a partial path $(c_0, c_1, \ldots, c_{j-1})$. A node at level n=8 corresponds to a complete path, that is a codeword, i.e., $(c_0, c_1, \ldots, c_{n-1})$. A node of level n is known as a goal node. During the process of emanating from the root node to the goal nodes, we have different paths which represent different codewords. For example, the uppermost path shown in FIG. 1b is completely constituted of solid lines, which the codeword 00000000 encoded from the information 0000.

The tree decoding process of the receiver end is to obtain path metrics according to the received signal r with respect to all of the paths (i.e., codewords). Then, a path having a best metric is selected as a decoded codeword. When an exhaustive search decoding mode is adopted, there would be $2^k$ paths to be calculated to obtain the path metrics. In this manner, the calculation complexity exponentially increases in accordance with k.

For purpose of Finding a solution of the complexity, Laura Ekroot published a thesis titled "A* Decoding of Block Codes" in volume 44 of IEEE Transactions on Communications (pages 1052 to 1056). In this paper, there is disclosed a method based on Dijkstra's algorithm using artificial intelligence, which is applied for the maximum-likelihood decoding of linear block codes. The A* decoding procedure as disclosed by Laura Ekroot is as following.

Supposing that the transmitted codeword is $c=(c_0, c_1, \ldots, c_{n-1})=(00111010)$, where n represents the length of the codeword, and the transmitted signal is $((-1)^{c_0}, (-1)^{c_1}, \ldots, (-1)^{c_{n-1}})=(1, 1, -1, -1, -1, 1, -1, 1)$. After the transmission, the signal received at the receiver end is $r=(r_0, r_1, \ldots, r_{n-1})=(0.6, 1.8, -1.1, -1.3, 0.9, 1.6, -1.0, -0.5)$, which is obtained by adding the noise signal to $(1, 1, -1, -1, -1, 1, -1, 1)$. All elements of r are rearranged in accordance with reliabilities thereof (absolute values of $r_i$), thus obtaining $r^*=(1.8, 1.6, -1.3, -1.1, -1.0, 0.9, 0.6, -0.5)$. Correspondingly, the generator matrix G is conducted with column exchanging in accordance with position change from r to $r^*$, so as to obtain $G^*$. Further, $G^*$ is applied with row operations to obtain a new systematic generator matrix of which 0 to $(k-1)^{th}$ columns constitute a k×k identity matrix. However, for some matrices, such as the present $G^*$, there is no way to obtain such a systematic generator matrix of which 0 to $(k-1)^{th}$ columns can constitute a k×k identity matrix by simply applying row operations. Under this circumstance, the sequence must be adaptively adjusted to obtain a new generator matrix G', as shown in FIG. 2a. In this case, $r^*$ is adjusted in accordance with the same sequence to obtain $r'=(1.8, 1.6, -1.3, -1.0, -1.1, 0.9, 0.6, -0.5)$. Next, the newly generated generator matrix G', and r' are employed to obtain a tree for decoding. After completing the decoding process, the sequence of the corresponding adjusted bits is recovered back to the original.

A part of the decoding tree for decoding the linear block code is shown in FIG. 2b. As shown in the upper side of FIG. 2b, a table proposed by Larura Ekroot for calculating bit metrics is provided in addition. When both of $(-1)^{c_i}$ and $r_i$ are positive or negative, a bit metric $M_b(c_i, r_i)$ corresponding to $c_i$ and $r_i$ is 0; or otherwise, the bit metric $M_b(c_i, r_i)$ corresponding to $c_i$ and $r_i$ is the absolute value of $r_i$. As shown in the lower side of FIG. 2b, contents of a stack required for A* decoding are provided.

At first, a path metric g(node 0) of the root node (node 0) of level 0 is assigned with 0. Emanating from node 0, there are two edges. One edge connects node 0 of level 0 and node 1 (representing $c_0=0$) of level 1; and the other edge connects node 0 of level 0 and node 2 (representing $c_0=1$) of level 1 respectively. It can be learnt from the table that the bit metric of $c_0=0$ is $M_b(c_0=0, r_0)=0$, and the bit metric of $c_0=1$ is $M_b(c_0=1, r_0)=1.8$. The path metrics of node 1 and node 2 are g(node 1)=g(node 0)+$M_b(c_0=0, r_0)$=0, and g(node 2)=g(node 0)+$M_b(c_0=1, r_0)$=1.8, respectively. Node 1 and node 2 are put in the stack. And then, one node, i.e., node 1 hereby, having the minimum path metric (the better path metric) is selected from node 1 and node 2 in the stack to be a pointer node. Hence, subsequent process starts from the pointer node, i.e., node 1.

Emanating from the pointer node (i.e., node 1 hereby), there are two edges which are connected to node 3 and node 4 of level 2 respectively. The path metric of node 3, g(node 3)=g(node 1)+$M_b(c_1=0, r_1)$=0, and the path metric of node 4, g(node 4)=g(node 1)+$M_b(c_1=1, r_i)$=1.6. The node 3 and node 4 are put in the stack and remain standby therein. The stack is arranged as the set of searched nodes according to partial path metrics of the nodes. A better path metric (i.e., smaller path metric in the current example) indicates a higher priority in the sequence. Therefore, node 4 is set beyond node 2. In the current stack, the nodes are sequentially ordered as node 3, node 4, and node 2. In a similar manner, node 3 having the minimum path metric in the stack is selected to be the pointer node, and the subsequent process starts from the pointer node, node 3. 100121 Emanating from the pointer node (i.e., node 3 hereby), there are two edges which are connected to node 5 and node 6 of level 3 respectively. The path metric of node 5, g(node 5)=g(node 3)+$M_b(c_2=0, r_2)$=1.3, and the path metric of node 6, g(node 6)=g(node 3) ±$M_b(c_2=1, r_2)$=0. The node 5 and node 6 are put in the stack and remain standby therein, and currently there are four nodes (node 2, node 4, node 5, and node 6) in the stack. In a similar manner, node 6 having the minimum path metric in the stack is selected to be the pointer node, and the subsequent process starts from the pointer node, node 6.

Emanating from the pointer node (i.e., node 6 hereby), there are two edges which are connected to node 7 and node 8 of level 4 respectively. The path metric of node 7, g(node 7)=1.0, and the path metric of node 8, g(node 8)=0. At level k=4, all information bits $u_0, u_1, u_2, u_3$ are determined, so that $p_4, p_5, p_6, p_7$ can be determined by the generator matrix G'. As such, the codewords passing through node 7 and node 8 have been respectively determined. Therefore, the paths represented by node 9 and node 10 of level 8 are determined. The path metric of node 9 is g(node 9)=1.6, and the path metric of node 10 is g(node 10)=1.4. The node of level n=8 is the goal node. However, the inferior goal node must be discarded. As such, if a present goal node having a path metric greater than the minimum path metric of all of the found goal nodes, the present goal node must be discarded, and at the same time, the best goal node having the minimum path metric is recorded. In this example, the minimum path metric of all the goal nodes that have been found is g(node 10)=1.4, and therefore currently there are two nodes, node 5 and node 10, in the stack.

Now, node 5 having the minimum path metric in the stack is selected to be the pointer node, and the subsequent process starts from the pointer node, node 5. It can be obtained that the path metric of node 11 is g(node 11)=2.3, and the path metric of node 12 is g(node 12)=1.3. Apparently, g(node 11)=2.3, is greater than the minimum path metric of the current goal nodes, g(node 10)=1.4, and therefore the path metric of node 11 should be discarded. Accordingly, currently there are two nodes, node 12 and node 10, in the stack.

In this case, node 12 now having the minimum path metric in the stack is selected to be the pointer node, and the subsequent process starts from the pointer node, node 12. It can be obtained that the path metric of node 13 is g(node 13)=3.9 which is greater than the minimum path metric of the current goal nodes, g(node 10)=1.4. Therefore the path metric of node 13 should be discarded. Accordingly. currently there is one node, i.e., node 10, in the stack.

In this case, the current stack has only one goal node, i.e., node 10, left. As such, the node 10 can be determined as the best one. Accordingly, the path c*=$(u_0, u_1, \ldots, u_{k-1}, p_0, p_1, \ldots, p_{n-k-1})$=(00111100) of the node 10 is the maximum likelihood codeword. Finally, the sequence of r' is recovered back to that of r, thus obtaining (00111010) and accordingly obtaining the information bits (0011).

Further, Yunghsiang S. Han has published a thesis titled "Efficient Priority-First Search Maximum-Likelihood Soft-Decision Decoding of Linear Block Codes" in volume 39 of IEEE Transactions on Information Theory (pages 1514 to 1523). Similar to the A* decoding procedure as disclosed by Laura Ekroot above, the starting steps of Yunghsiang S. Han can be learnt by referring to FIG. 2b. Further, in the method of Yunghsiang S. Han, the minimum Hamming distance between the codewords is employed.

As disclosed by Yungshiang S. Han, a decoded codeword is selected as a reference seed. Then, according to the order of sequences in the stack, and the minimum Hamming distance d, the nodes in the stack are sequentially calculated for obtaining corresponding bounds of estimated path metrics thereof. When a lower metric is desired, the bound is a lower bound. When the lower bound of the estimated path metric of the node is greater than the path metric of the reference seed, it can be determined that the best path does not pass through the instant node, and therefore the instant node can be eliminated from the current stack. The decoding method is executed until the maximum likelihood codeword having the minimum path metric is found.

With respect to the example of FIG. 2b, the reference seed is a path c* represented by node 10. The reference seed is selected during the decoding process, and in this case the node at the top of the stack is node 5. The distance between the partial path represented by node 5 and the corresponding part of c* is 1. Since the minimum Hamming distance of this (8, 4) extended Hamming code is d=4, the remaining part of each path passing through node 5 must include at least 3 additional bits different from the corresponding part in c*. Consider the best case, there are only three bits different from c* that may result in the minimum possible path metric. Specifically, three bits which are different from c* are selected from the non-decoded part subsequent to node 5, and the minimum possible accumulated edge metric thereof is calculated. In the current example, the last three bits (i.e., $c_5, c_6$, and $c_7$) are different from c* for which the associated edge metrics are 0, 0.6, and 0, respectively. As such, the minimum possible accumulated edge metric (lower bound) is 0+0.6+0 =0.6. Adding the minimum possible accumulated edge metric 0.6 to the path metric 1.3 of node 5, the minimum possible path metric of the path passing through node 5 is obtained as 1.3+0.6=1.9, which is greater than the path metric 1.4 of c*. Therefore, it can be concluded that the best path won't pass through node 5. As such, node 5 should be eliminated from the stack.

Subsequently, the foregoing calculation is repeated for any node that is not a goal node in the stack.

Briefly, the method of Yunghsiang S. Han selects a decoded codeword serving as a reference seed, and utilizes the minimum Hamming distance between codewords to pre-estimate the minimum possible path metric of the possible codeword. In such a way, it can be previously learnt that which node should be discarded.

However, when utilizing the foregoing decoding method for decoding longer linear block codes, the decoding complexity thereof is still too high. As such, an improved decoding method for further reducing the decoding complexity is highly desired.

SUMMARY OF THE INVENTION

A primary objective of the present invention is to provide a tree decoding method for decoding linear block codes. This tree decoding method can not only reduce the decoding complexity no matter when the stack is finite or infinite, but also achieve a relatively low error rate when the stack is finite.

The estimated path metric of node v is set as f(v)=g(v)+h(v), in which g(v) represents the path metric from the root node to node v, and h(v) represents an estimation of the best possible accumulated edge metric from node v to the goal node, i.e., a lower (upper) bound of the accumulated edge metric if a smaller (greater) metric is a better metric. The above-mentioned method which is proposed by Yunghsiang S. Han to utilize the minimum Hamming distance between codewords for estimating the bound of the accumulated edge metric thereof can be used for calculating h(v).

The present invention is an efficient method of calculating h(v). According to the present invention, some parity bits are only related to a part of the information bits, and hence the metric h(v) of the parity bits can be preliminarily incorporated into the path metric of the part of the information bits. As such, some nodes having inferior path metrics could be eliminated in advance, thus minimizing the searching range and simplifying the decoding. complexity.

Further, the present invention utilizes g(v) for determining whether or not to discard a node because of the limited size of the stack, otherwise f(v) is utilized in determining whether or not to eliminate the node which is apparently unlikely.

BRIEF DESCRIPTION OF THE DRAWINGS

The present invention will be apparent to those skilled in the art by reading the following detailed description of a preferred embodiment thereof, with reference to the attached drawings, in which:

FIG. 1a is a schematic diagram illustrating a generator matrix G through which the 4-bit information can be encoded into a codeword of length 8;

FIG. 1b is a schematic diagram illustrating a code tree obtained from the generator matrix of FIG. 1a;

FIG. 2a is a schematic diagram illustrating the conversion of the generator matrix of FIG. 1a into another generator matrix G';

FIG. 3a is a schematic diagram illustrating the conversion of the generator matrix of FIG. 1a into another generator matrix G'';

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention, and together with the description, serve to explain the principles of the invention.

Supposing a node having a code number v, and the estimated path metric of node v is set as $f(v)=g(v)+h(v)$, in which $g(v)$ represents the path metric from the root node to the node v, and $h(v)$ represents an estimation of the best possible accumulated edge metric from the node v to the goal node. In accordance with the present invention, the method of calculating $h(v)$ is very efficient, so as to allow an effective bound on the possible path metrics of all codewords passing through the node v before decoding the entire codeword. In such a way, the useless nodes can be discarded in advance, and the decoding complexity can be reduced.

Figure 1B:
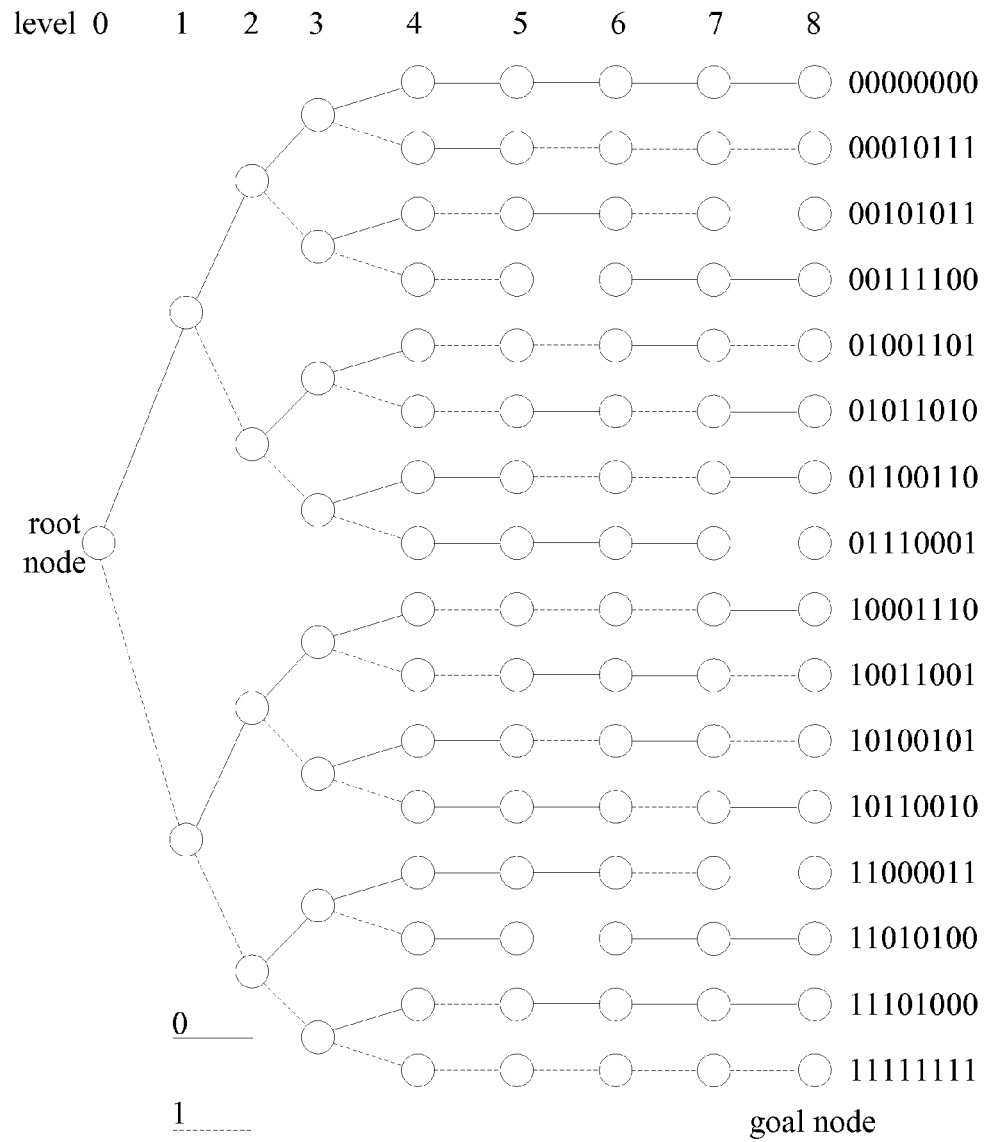
Figure 2B:
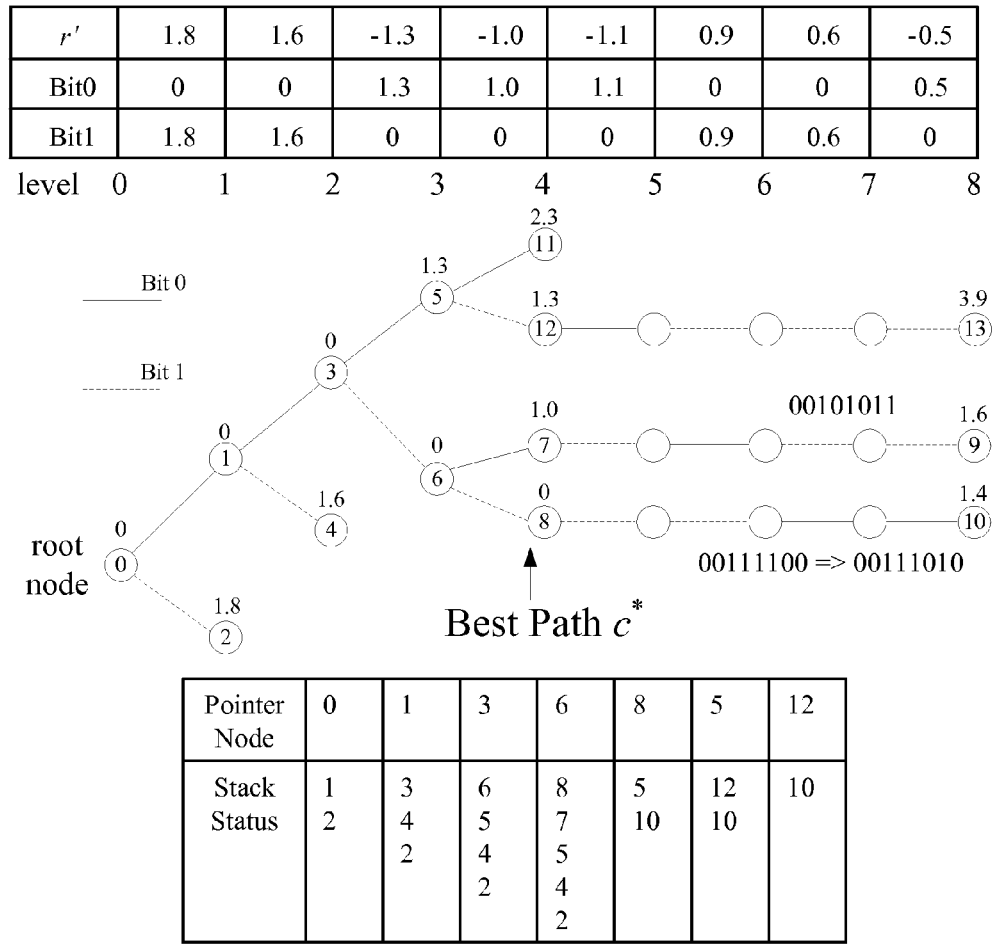
FIG. 2b is a schematic diagram illustrating a decoding process based on the generator matrix G' of FIG. 2a according to a conventional technology.
Figure 2C:
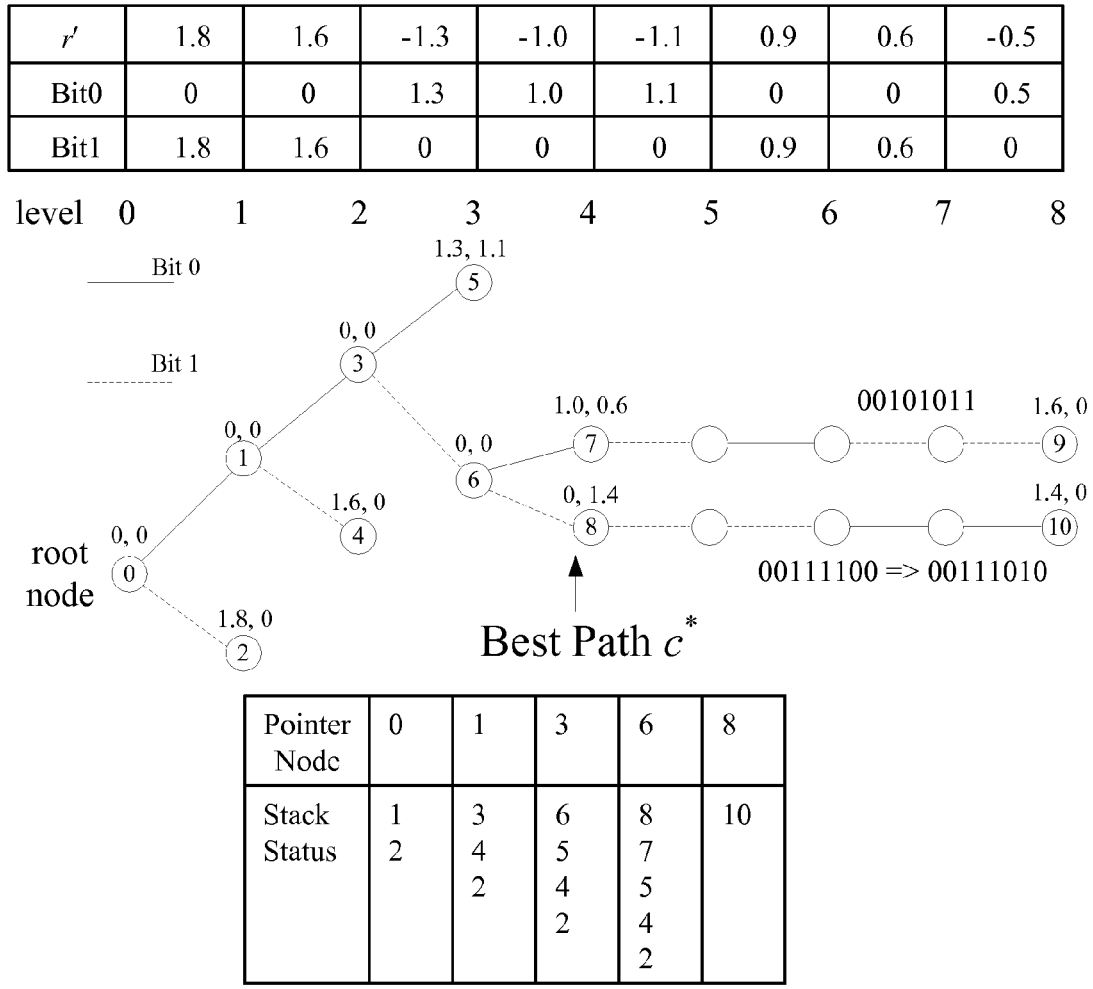
FIG. 2c is a schematic diagram illustrating a decoding process based on the generator matrix G' of FIG. 2a according to a first embodiment of the present invention.

FIG. 2a is a schematic diagram illustrating the conversion of the generator matrix of FIG. 1a into another generator matrix G'. FIG. 2c is a schematic diagram illustrating a decoding process based on the generator matrix G' of FIG. 2a according to a first embodiment of the present invention. The first embodiment of the present invention is an efficient method for calculating h(v). Referring to FIG. 2a, it can be learnt that the first parity bit, i.e., the fifth leftmost bit, is only related to the prior 3 information bits. Specifically, the value of the first parity bit is obtained by a XOR operation of the prior 3 information bits. As such, during the decoding process, the first parity bit can be determined by only the knowledge of the prior 3 information bits, without the need of other the information bits. In such a way, some erroneous paths can be eliminated in advance by the knowledge of the parity bits, so that the decoding complexity can be reduced accordingly.

Taking the generator matrix G' of FIG. 2a for example, the method according to the current embodiment can be learnt by referring to FIG. 2c as following.

At first, f(node 0)=g(node 0) is assigned with 0. Starting from node 0, the estimated path metrics of node 1 and node 2 are respectively f(node 1)=g(node 1)=0, and ((node 2)=g(node 2)=1.8. In this case, the first information bit $u_0$ cannot determine any parity bit, and therefore h(node 1) and h(node 2) are both 0. The sequence of the stack is set in accordance with g(v) as, node 1, node 2. Node 1 has the smaller path metric g(v) therebetween, and therefore node 1 is selected serving as the pointer node. And then, the decoding process starts from node 1.

From the pointer node, i.e., node 1, we obtain f(node 3)=g(node 3)=0, and f(node 4)=g(node 4)=1.6. In this case, the information bits $u_0$ and $u_1$ cannot determine any parity bit, and therefore h(node 3) and h(node 4) are both 0. The sequence of the stack is set in accordance with g(v) as, node 3, node 4, and node 2. Node 3 has the smallest path metric therebetween, and therefore node 3 is selected serving as the pointer node. And then, the decoding process starts from node 3.

From the pointer node, i.e., node 3, we obtain f(node 5)=g(node 5)+h(node 5)=1.3 +1.1 =2.4, and f(node 6)=g(node 6)+h(node 6)=0. In this case, the information bits $u_0$, $u_1$, and $u_2$ can determine a parity bit $p_4$, and therefore h(node 5)=$M_b(p_4=0, r_4)$=1.1, and h(node 6)=$M_b(p_4=1, r_4)$=0. The sequence of the stack is set in accordance with g(v) as, node 6, node 5, node 4, and node 2. Node 6 has the smallest path metric therebetween, and therefore node 6 is selected serving as the pointer node. And then, the decoding process starts from node 6.

From the pointer node, i.e., node 6, we obtain ((node 7)=g(node 7)+h(node 7)=1.0 +0.6 =1.6, and f(node 8)=g(node 8)+h(node 8)=0+1.4=1.4. In this case, the information bits $u_0$, $u_1$, $u_2$, and $u_3$ can determine a parity bits $p_4$, $p_5$, $p_6$, and $p_7$, and therefore h(node 7)=h(node 6)+$M_b(p_5=0, r_5)$+$M_b(p_6=1, r_6)$+$M_b(p_7=1, r_7)$=0+0+0.6+0=0.6, and h(node 8)=h(node 6)+$M_b(p_5=1, r_5)$+$M_b(p_6=0, r_6)$+$M_b(p_7=0, r_7)$=0+0.9+0+0.5=1.4. Till now, all bits $u_0$, $u_1$, $u_2$, and $u_3$, and $p_4$, $p_5$, $p_6$, and $p_7$ have been considered, and therefore the goal nodes corresponding to the node 7 and node 8, respectively, are node 9 and node 10, which metrics are f(node 9)=f(node 7)=1.6, f(node 10)=f(node 8)=1.4. In this case g(node 9)=f(node 9), and g(node 10)=f(node 10).

In the current stack, those nodes having estimated path metrics f(v) greater than the minimum path metric g(node 10)=f(node 10) of the currently found goal node are discarded. Accordingly, there is only one goal node, i.e., node 10, left in the stack. As such, it can be concluded that node 10 is the best node.

Figure 3B:
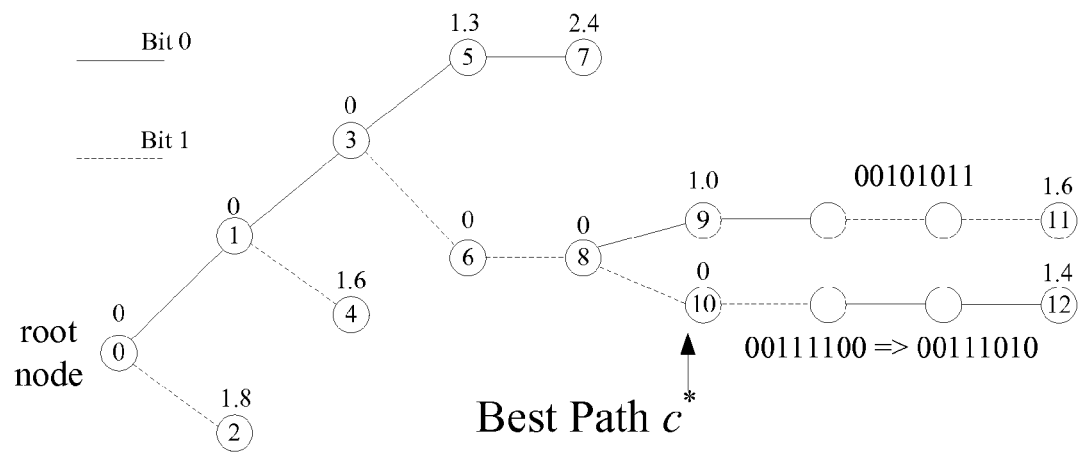
FIG. 3b is a schematic diagram illustrating a decoding process based on the generator matrix G'' of FIG. 3a according to a second embodiment of the present invention.

Alternatively, another equivalent approach can be used for achieving similar effect without employing the estimated path metric f(v). The equivalent approach requires modifying the systematic generator matrix. In a second embodiment, because the first parity bit is only related to the prior 3 information bits, and therefore the $5^{th}$ column of G' can be moved forward to the position of the $4^{th}$ column, thus obtaining a new generator matrix G", as shown in FIG. 3a. FIG. 3a is a schematic diagram illustrating the conversion of the generator matrix of FIG. 1a into another generator matrix G". FIG. 3b is a schematic diagram illustrating a decoding process based on the generator matrix G" of FIG. 3a according to a second embodiment of the present invention.

At beginning of the decoding process, g(node 0) is assigned as 0. Starting from the node 0, it can be obtained that the path metrics of node 1 and node 2 are g(node 1)=0 and g(node 2)=1.8, respectively. Node 1 having a smaller path metric therebetween is selected as a pointer node. From the pointer node, node 1, we obtain g(node 3)=0, and g(node 4)=1.6. In this time, the stack includes three nodes therein, and the three nodes are set in order according to the value of g(v), as node 3, node 4, and node 2. Node 3 having the smallest path metric in the stack is selected to be the pointer node. From the pointer node, node 3, we obtain g(node 5) =1.3, and g(node 6)=0. At this time, the first parity bit can be determined. The bit $p_4$ from level 3 to level 4 is a parity bit, and therefore there is only one edge which emanates from level 3 to level 4. As such, node 5 is connected to node 7, and node 6 is connected to node 8, and the path metrics thereof are g(node 7)=2.4 and g(node 8)=0, respectively.

The instant stack now includes node 8, node 4, node 2 and node 7, arranged in that sequence in accordance with the value of g(v) thereof. Node 8, having the minimum path metric therebetween is selected serving as the pointer node. From the instant pointer node, i.e., node 8, path metrics of node 9 and node 10 are respectively obtained as, g(node 9)=1.0 and g(node 10)=0. In this case, the two codewords respectively passing through the node 9 and node 10 are determined. Therefore, node 9 and node 10 are connected to goal node 11 and goal node 12 respectively, in which g(node 11)=1.6 and g(node 12)=1.4, as shown in FIG. 3b.

In the current stack, those nodes having path metrics g(v) greater than the minimum path metric g(node 12)=1.4 of the currently found goal node are discarded. Accordingly, there is only one goal node, i.e., node 12, left in the stack. As such, it can be concluded that the path passing through node 12 represents the maximum likelihood codeword.

In other words, related to a part of the information bits, according to which the metric h(v) of the parity bits can be preliminarily incorporated into the path metric of the part of the information bits. As such, some nodes having inferior path metric could be eliminated in advance, thus minimizing the searching range and simplifying the decoding complexity.

The parity bits only related to a part of the information bits can be determined in accordance with the following approach. Considering the $j^{th}$ column of the systematic generator matrix G', where n-k≦j≦n-1. If all of the $i^{th}$ to the $(k-1)^{th}$ elements among the $0^{th}$ to $(k-1)^{th}$ elements of this column are 0, then the $j^{th}$ parity bit is only related to the 0 to $(i-1)^{th}$ information bits.

Alternatively, the foregoing first embodiment can also determine the order of the stack in accordance with the estimated path metric f(v). When the stack has an infinite size, this approach does not affect the bit error rate, but increases the amount of searched paths. When the stack has a finite size, it may suffer some adverse effects of correct paths being discarded by the finite stack due to some additionally accumulated edge metrics of some parity bits.

Now, with respect to extended quadratic residue codes, the first embodiment is simulated for decoding, and for comparing with the simulated methods proposed by Larura Ekroot and Yuanhsian S. Han, respectively, without changing the c* reference seed.

Figure 4A:
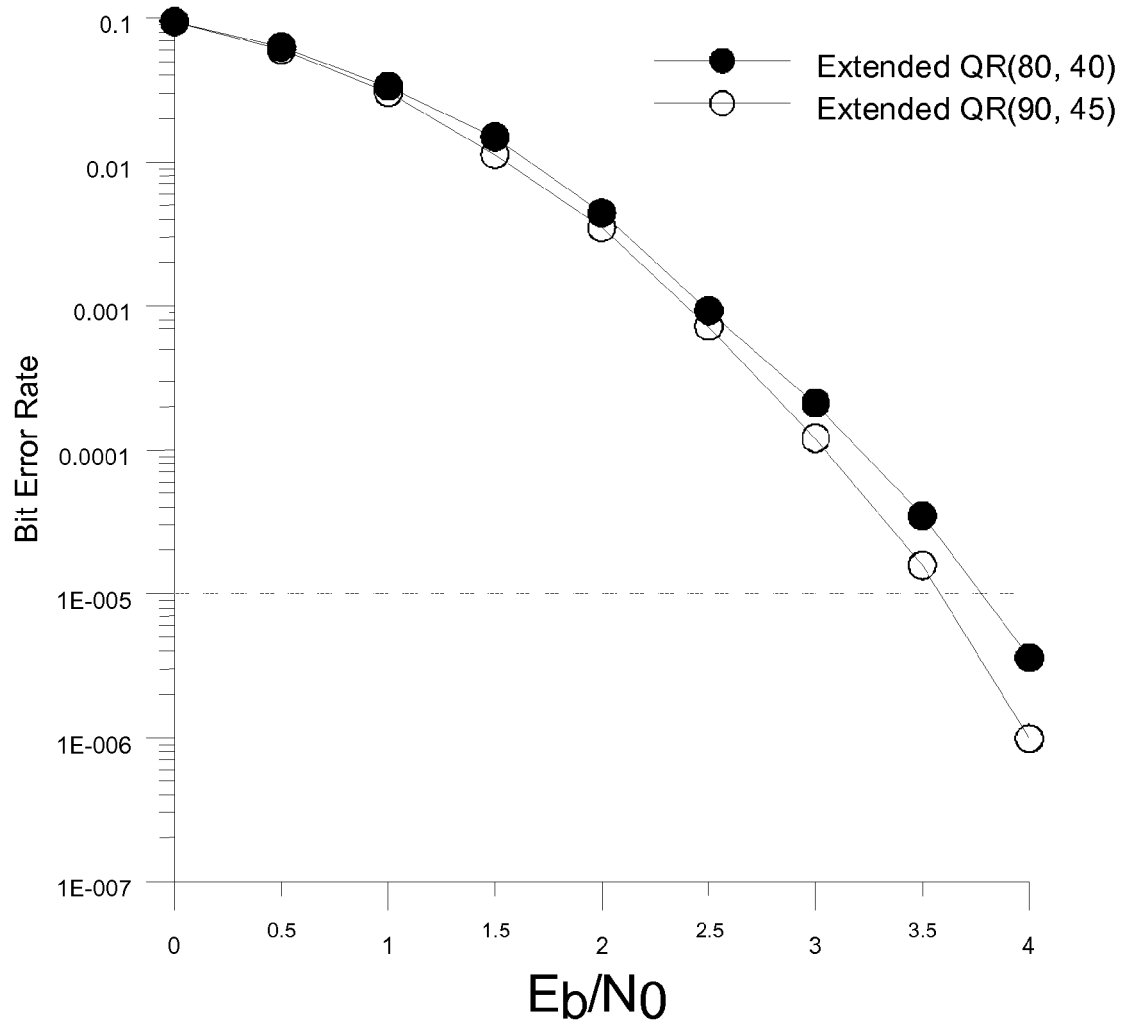
FIG. 4a illustrates the bit error rates of the (80, 40), and (90, 45) extended quadratic residue codes using the stack of infinite size.

FIG. 4a illustrates the bit error rates of the (80, 40) and (90, 45) extended quadratic residue codes using infinite stack size. Referring to FIG. 4a, when the stack size is not restricted, each of the foregoing three methods can achieve the maximum likelihood codeword, and the corresponding bit error rate is as shown in FIG. 4a. In FIG. 4a, the horizontal axis represents the signal-to-noise ratio, where $E_b$ represents the energy required for transmitting every information bit, and $N_0$ represents one-sided power spectral density of the additive white Gaussian noise.

Figure 4B:
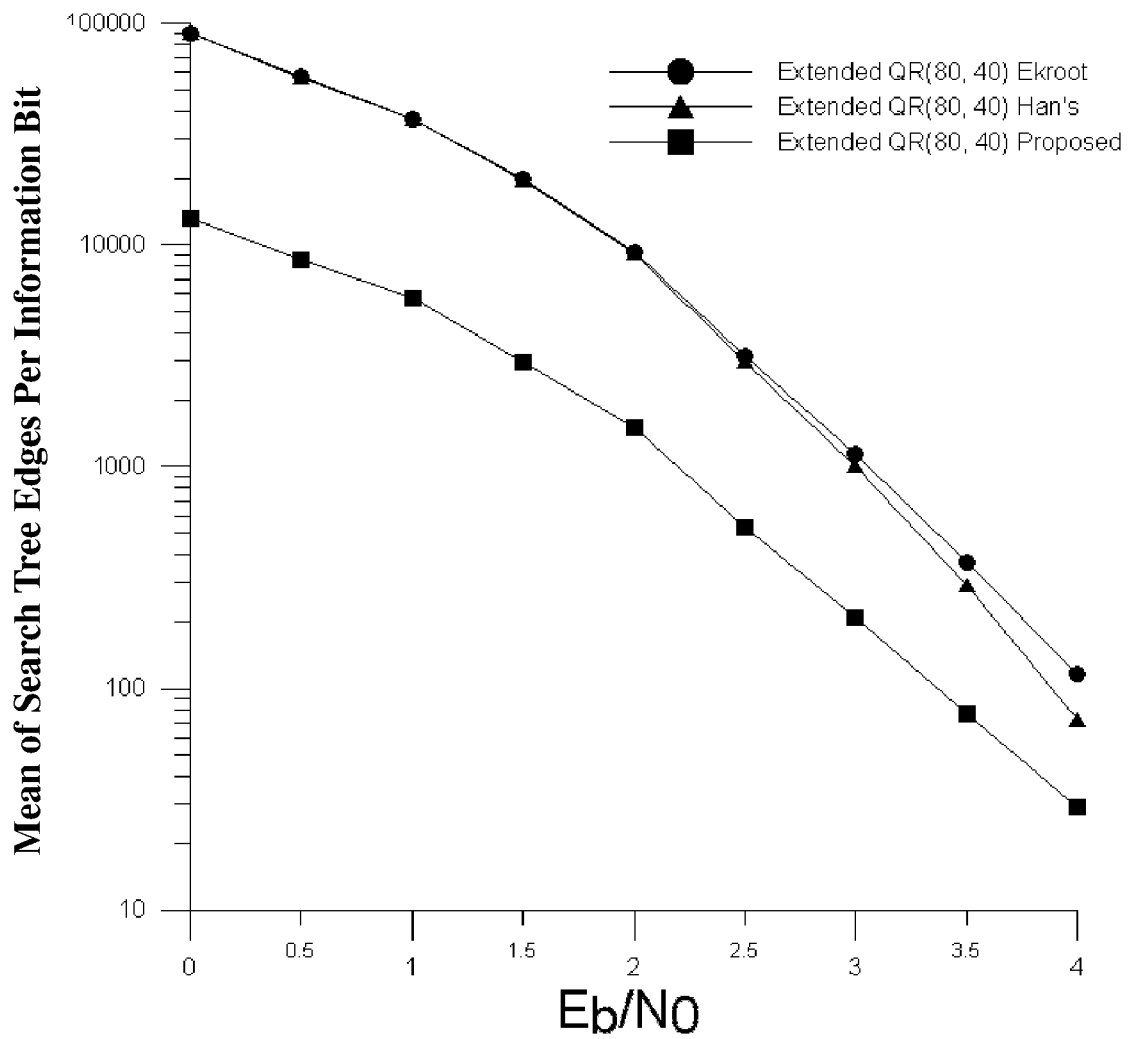
FIG. 4b illustrates the mean of search tree edges per information bit of the (80, 40) extended quadratic residue code using the stack of infinite size.

The amount of the search tree edges is used for estimating the complexity of the (80, 40) extended quadratic residue code, as shown in FIG. 4b. FIG. 4b illustrates the mean of search tree edges per information bit of the (80, 40) extended quadratic residue code using infinite stack. As shown in FIG. 4b, during a maximum-likelihood decoding of linear block codes, the method proposed by the present invention has a smallest mean of search tree edges per information bit.

Figure 4C:
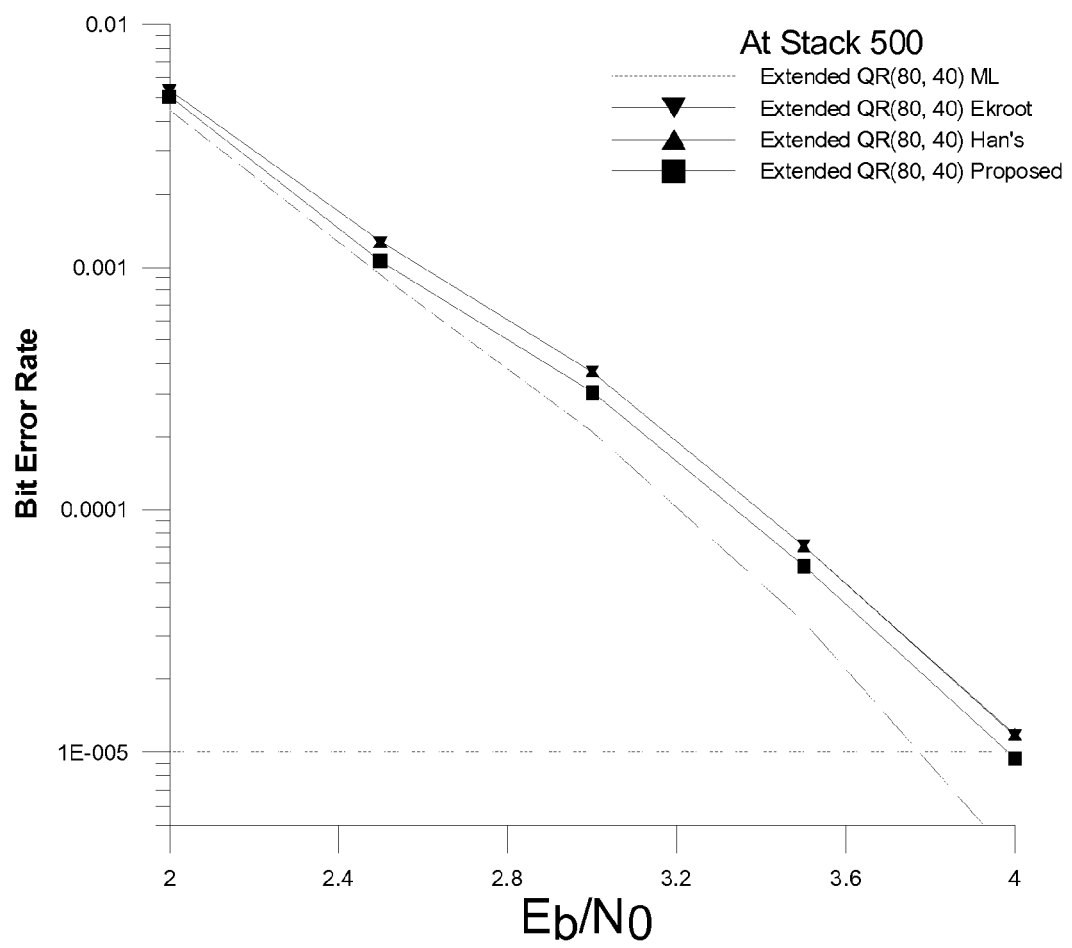
FIG. 4c illustrates the bit error rates of the (80, 40) extended quadratic residue code, while the stack is restricted to 500 nodes.

In a similar manner, the (80, 40) extended quadratic residue code is decoded, where the stack size is restricted to 500 nodes. In this case, none of the proposed method of the present invention, the Ekroot's method, and the Han's method can achieve the maximum likelihood codeword, and the corresponding bit error rates thereof are shown in FIG. 4c in comparison with the bit error rate of the maximum likelihood decoding. However, it can be seen that the proposed method of the present invention has the best bit error rate performance.

Figure 4D:
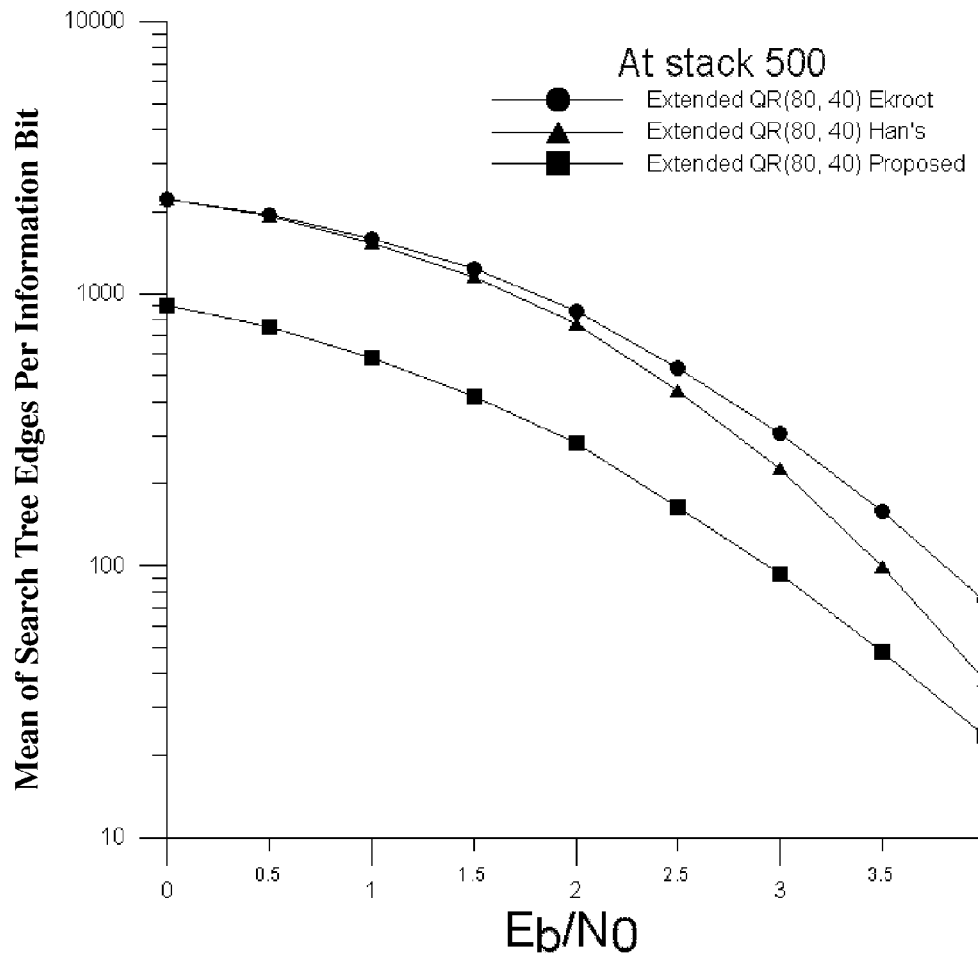
FIG. 4d illustrates the mean of search tree edges per information bit of the (80, 40) extended quadratic residue codes, while the stack is restricted to 500 nodes.

FIG. 4d illustrates the mean of search tree edges per information bit of the (80, 40) extended quadratic residue code, where the stack size is restricted to 500 nodes. Referring to FIG. 4d, when the stack size is restricted to 500 nodes, the complexity of decoding the (80, 40) extended quadratic residue code is estimated according to the amount of the search tree edges. As shown in FIG. 4d, among the proposed method of the present invention, the Ekroot's method, and the Han's method, the proposed method of the present invention achieves the smallest mean of search tree edges per information bit.

As such, it can be concluded that, comparing with the conventional technologies, the method proposed by the present invention is efficient for not only reducing the decoding complexity no matter when the stack is finite or infinite, but In summary, the present invention further provides more details for illustrating the steps of the tree decoding method for decoding the linear block code according to the present invention below.

According to the present invention, a generator matrix corresponding to an (n,k) linear block code is G, where n represents a length of the codeword, and k represents the length of the information bits thereof. $c=(c_0, c_1, \ldots, c_{n-1})$ represents an n-bit codeword, and $r=(r_0, r_1, \ldots, r_{n-1})$ represents a received signal.

In decoding the (n,k) linear block code, the tree decoding method defines $M_b(c_i, r_i)$ as a bit metric corresponding to $c_i$ and defines a node having a code number v with functions f, g, h and a stack. The estimated path metric of node v is set as $f(v)=g(v)+h(v)$, in which g(v) represents the path metric from the root node to the node v, and h(v) represents the estimation of the best possible accumulated edge metric from the node v to the goal node. In accordance with the present invention, the method of calculating h(v) is featured in that, if some parity bits positioned between the node v and the goal node can be determined by the information bits from the root node to the node v, then the bit metrics of the parity bits are accumulated serving as the h(v), or otherwise h(v)=0.

When emanating, a node having a smaller g(v) is selected from the nodes from which no descendant nodes have emanated as a pointer node to start emanating therefrom, and the rest nodes are put in the stack and set in order according to the value of g(v) from best to worst. The tree decoding method includes the following steps:

1. setting a sequence of the received signal r in accordance with reliabilities thereof, and obtaining r', and exchanging columns of the generator matrix G of r, so as to obtain G*, and then simplifying G* to obtain a systematic generator matrix G', and decoding according to G';

2. at the beginning of decoding, assigning the root node as a pointer node that g(v)=0 and h(v)=0, setting a very poor metric value as $f(v_{best})$, and setting an initial node of $v_{best}$ as $v_\infty$, in which $v_\infty$ is a virtual node:

3. emanating from the pointer node to descendant nodes, and when the f(v) of a descendant node is better than $f(v_{best})$, the descendant node is recorded into the stack, and when the stack is full, the node having the worst g(v) is preferentially discarded:

4. selecting a node v having the best g(v) among the nodes currently in the stack, and assigning the selected node as the pointer node, and if a path from the root node to the pointer node does not include all of the information bits, turning back to step 3;

5. currently, the path from the root node to the pointer node including all of the information bits, and an estimated path metric of the entire codeword passing through the node v being f(v), if f(v) is worse than or equal to $f(v_{best})$, then discarding node v, or otherwise if f(v) is better than $f(v_{best})$, then assigning $v_{best}=v$, and eliminating each node w in the stack for f(w) is worse than $f(v_{best})$; and 6. if $v_{best}$ is the only node left in the stack, conducting a reverse operation of the sequence setting of step I to the codeword passing through $v_{best}$ to obtain an original codeword, and if there are more than 1 node left in the stack, then selecting the node v having the best g(v) from the stack serving as the pointer node, and turning back to step 4.

In the foregoing steps 4 and 6, the present invention is exemplified as selecting the node having the best g(v) for illustration. However, in practice, the node having the best f(v) can also be selected serving as the pointer node.

As discussed above, f(v) or g(v) are used for comparison thus selecting a better one therefrom. In the current embodiment, the function f( ) and g( ) are exemplified as the superior function having a smaller value and the inferior function having a greater value. However, in practice, the functions may also be modified as the superior function having a greater value and the inferior function having a smaller value. In the former situation as exemplified in the embodiments of the present invention, $f(v_{best})$ is set as a great positive number at the beginning. On the contrary, in the latter situation, $f(v_{best})$ is set as a negative number having a great absolute value at the beginning.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A tree decoding method for decoding a linear block code (n, k), the linear block code having a generator matrix G, where $c=(c_0, c_1, \ldots, c_{n-1})$ represents a transmitted codeword, $r=(r_0, r_1, \ldots, r_{n-1})$ represents a received signal, n represents a length of the codeword, and k represents a length of information bits, the tree decoding method comprising the steps of:

(1) setting a sequence of the received signal $r=(r_0, r_1, \ldots, r_{n-1})$ in accordance with reliabilities thereof, respectively, thus obtaining r', and exchanging columns of the generator matrix G of r, thus obtaining G*, and then simplifying G* to obtain a systematic generator matrix G' as well as a code tree of G', where a path of the code tree is a codeword $c'=(c'_0, c'_1, \ldots, c'_{n-1})$, wherein c' comprises k information bits $(u_0, u_1, \ldots, u_{k-1})$ and n-k parity bits $(p_k, p_{k+1}, \ldots, p_{n-1})$;

(2) according to the code tree of G', providing a bit metric $M_b(c'_i, r'_i)$ corresponding to $c'_i$, and $r'_i$, functions f, g, h, and a stack, wherein with respect to a node having a code number v, i.e., node v, it is assigned that $f(v)=g(v)+h(v)$, wherein g(v) represents a sum of bit metrics of all bits on a path from the root node to the node v, and h(v) is determined in that when there is any parity bit between the node v and a goal node that can be determined by the information bits between the root node and the node v, the bit metric of the parity bit is accumulated to h(v), otherwise h(v)=0;

(3) assigning the root node as a pointer node, i.e., node v, which g(v)=0 and h(v)=0, setting a very poor metric value as an initial $f(v_{best})$, and setting an initial node of $v_{best}$ as $v_\infty$, wherein $v_\infty$ is a virtual node;

(4) emanating from the pointer node to descendant nodes, and when the f(v) of the descendant node is better than $f(v_{best})$, recording the descendant node in the stack;

(5) selecting the best node v from the stack and assigning the selected node v as the pointer node, wherein if the path from the root node to the pointer node does not include all information bits, the method returns back to step (4);

(6) till now, the path from the root node to the pointer node comprising all of the information bits, and an estimated path metric of the entire codeword passing through the node v being f(v), and if f(v) is worse than or equal to $f(v_{best})$, then discarding node v, otherwise if f(v) is better than $f(v_{best})$, then assigning $v_{best}=v$, and eliminating each node w in the stack for f(w) is worse than f(v); and (7) if $v_{best}$ is the only node left in the stack, conducting a reverse operation of the sequence setting of step 1 to the codeword passing through $v_{best}$ to obtain an original codeword, and if there are more than 1 node left in the stack, then turning back to step (5).

2. The tree decoding method according to claim 1, wherein the best node v in the stack is a node having a best g(v) in the stack.

3. The tree decoding method according to claim 2, wherein g(a) of node a being better (or worse) than g(b) of node b indicates that g(a) is smaller (or larger) than g(b).

4. The tree decoding method according to claim 3, wherein $f(v_{best})$ is set as an extremely large positive number at the beginning.

5. The tree decoding method according to claim 2, wherein g(a) of node a being better (or worse) than g(b) of node b indicates that g(a) is larger (or smaller) than g(b).

6. The tree decoding method according to claim 5, wherein $f(v_{best})$ is set as a negative number having an extremely large absolute value at the beginning.

7. The tree decoding method according to claim 1, wherein the best node v in the stack is a node having a best f(v) in the stack.

8. The tree decoding method according to claim 1, wherein prior k bits of any path of the code tree of the systematic generator matrix G' are information bits $(u_0, u_1, \ldots, u_{k-1})$, and last n-k bits of the path of the code tree of the systematic generator matrix G' are parity bits $(p_k, p_{k+1}, \ldots, p_{n-1})$, the method further comprising: when $p_{i1}, p_{i2}, \ldots, p_{im}$ are all parity bits which can be determined by $u_0, u_1, \ldots, u_j$, but cannot be determined by $u_0, u_1, \ldots, u_{j-1}$, moving the column $i_2, \ldots, i_m$ of G' to behind the column representing $u_j$.

9. The tree decoding method according to claim 1 further comprising: when the stack is full and a node is required to be discarded, discarding the node having the worst g(v).

10. The tree decoding method according to claim 1, wherein f(a) of node a being better (or worse) than f(b) of node b indicates that f(a) is smaller (or larger) than f(b).

11. The tree decoding method according to claim 10, wherein $f(v_{best})$ is set as an extremely large positive number at the beginning.

12. The tree decoding method according to claim 1, wherein f(a) of node a being better (or worse) than f(b) of node b indicates that f(a) is larger (or smaller) than f(b).

13. The tree decoding method according to claim 12, wherein $f(v_{best})$ is set as a negative number having an extremely large absolute value at the beginning.

\* \* \* \* \*